United States Patent
Ko et al.

(10) Patent No.: US 12,298,339 B2
(45) Date of Patent: *May 13, 2025

(54) INTERACTIVE TEST EQUIPMENT FOR QUALITY EVALUATION OF INSULATIVE ELECTRIC RESISTANCE VALUE OF ELECTRIC POWER CABLE

(71) Applicant: Po-Cheng Ko, Taichung (TW)

(72) Inventors: Po-Cheng Ko, Taichung (TW); Chun-Yao Ko, Taichung (TW); Chih-Ting Ko, Taichung (TW)

(73) Assignee: Po-Cheng Ko, Taichung (TW)

( * ) Notice: Subject to any disclaimer, the term of this patent is extended or adjusted under 35 U.S.C. 154(b) by 296 days.

This patent is subject to a terminal disclaimer.

(21) Appl. No.: 17/931,912

(22) Filed: Sep. 14, 2022

(65) Prior Publication Data
US 2023/0104141 A1 Apr. 6, 2023

(30) Foreign Application Priority Data
Oct. 4, 2021 (TW) .................................. 110136916

(51) Int. Cl.
*G01R 31/12* (2020.01)

(52) U.S. Cl.
CPC ................................ *G01R 31/1272* (2013.01)

(58) Field of Classification Search
CPC ................ G01R 31/12; G01R 31/1272; G01R 31/1263; G01R 31/52; G01R 31/32; G01R 31/327; G01R 27/025; G01R 27/2617; G01R 31/28; G01R 31/2812; G01R 31/2831; G01R 17/105; G01R 27/02; G01R 31/58; G01R 31/3275; G01R 31/31835; Y04S 10/40
See application file for complete search history.

(56) References Cited

U.S. PATENT DOCUMENTS

| 2017/0315205 | A1* | 11/2017 | Hackl | ..................... | G01R 35/00 |
| 2023/0108966 | A1* | 4/2023 | Ko | .......................... | G01R 31/52 |
| | | | | | 324/424 |

FOREIGN PATENT DOCUMENTS

| CN | 113295977 | A | * | 8/2021 | ......... | G01R 31/1272 |
| CN | 113341281 | A | * | 9/2021 | | |

* cited by examiner

*Primary Examiner* — Son T Le
(74) *Attorney, Agent, or Firm* — Cheng-Ju Chiang

(57) ABSTRACT

An interactive test equipment for quality evaluation of an insulative electric resistance value of an electric power cable at least includes a controller, a question type tester and an operator. The question type tester includes at least a test set. Each of the at least a test set includes at least an electric resistance value measurer each of which has an electric voltage value display and an electric resistance value display to respectively display electric voltage values and electric resistance values of a corresponding cable. Besides, the operator is used to initiate the interactive test equipment, to select answers, and the controller is used to load question types and to make judgment on answers. Accordingly, test subjects are authenticated and evaluated for a judgment ability thereof in order for ensuring safety of a working environment.

4 Claims, 4 Drawing Sheets

INTERACTIVE TEST EQUIPMENT FOR QUALITY EVALUATION OF INSULATIVE ELECTRIC RESISTANCE VALUE OF ELECTRIC POWER CABLE

BACKGROUND OF THE INVENTION

Field of the Invention

The present invention relates to a test technical field of power using safety, particularly relates to an interactive test equipment for quality evaluation of an insulative electric resistance value of an electric power cable. The interactive test equipment in accordance with the present invention is used to allow test subjects determining whether a cable is in a good or poor condition through an interactive test method, and then to authenticate and evaluate a judgment ability of the test subjects in order for ensuring that the test subjects can immediately find out whether the cable is normal in time.

Description of Related Art

"Electricity" which has been discovered and rapidly developed since the eighteenth century has brought huge changes to industry and society. While "electricity" brings convenience to people, there is also a risk of getting electric shocks and other risks for electricity use. Hence, no matter where places to use electricity are and what kinds of power related equipment, devices and parts, etc. are used, safety knowledge must be possessed and relevant laws and regulations must be followed in order to conveniently and safely use electricity.

According to ordinary power distribution method, external power source is electrically connected with corresponding power using equipment based on different power usage specifications after passing through electricity meters, non-fuse switches and transformers. For example, common household electricity boxes can be divided into power panels with larger power consumption and light panels with lower power consumption. The power panels are usually set as a three-phase four-wire voltage of 380V or 220V, and are respectively electrically connected with air conditioners or water heaters using electric powers with a three-phase voltage of 380V, or with electric heaters using electric powers with a single-phase voltage of 220V. The light panels are usually set as a three-phase four-wire voltage of 120V or 208V, and are respectively electrically connected with air conditioners or water heaters using electric powers with a three-phase voltage of 220V, or with electric sockets using electric powers with a single-phase voltage of 120V. Since respective transformers are electrically connected with power using equipment (such as air conditioners, water heaters, electric heaters or electric sockets) through electric connective cables, leaking electric currents may cause energy waste and damage on the power using equipment or electricity equipment when the electric connective cables are damaged or worn to invalidate insulation effect thereof. Furthermore, even safety of human bodies and properties may be endangered due to possible electric shock.

Accordingly, workers are required to determine whether a corresponding cable is in a good or poor condition via measuring insulation electric resistance values between a cable and another cable (cable/cable) or between a cable and ground (cable/ground) in order to ensure safety of electricity use. Ability of the workers for quality evaluation of cable insulation becomes very important as well.

Therefore, in order to ensure that workers can immediately determine whether a cable is in a good or poor condition through measuring insulative electric resistance values during work, it is necessary to arrange regular or irregular return training and testing for the workers to ensure that they have a good judgment ability. However, existing test methods are proceeded for testing based on pre-edited test papers. Questions thereof are monotonous and their answers are fixed. As a result, tests based on them are not interactive and realistic. Taking tests becomes a superficial operation for the workers. Actual judgment ability of the workers for quality evaluation of cable insulation cannot be effectively understood.

In other words, a solution how to overcome shortcomings of the existing methods to use fixed test papers for testing, and how to make return training and tests for the workers become more variable and interactive to have a reality simulation effect is highly expected by the related industry and is also intended to be researched through the present invention.

Hence, the inventors of the present invention deeply research problem encountered by test subjects when they take existing cable insulation tests. Based on many years of rich experience in research, development and manufacture in the related industry and after continuous hard working and effort of research and trial production, an interactive test equipment for quality evaluation of an insulative electric resistance value of an electric power cable in accordance with the present invention is finally successfully developed to overcome trouble and inconvenience caused by deficiency of variety and interaction in the existing art.

BRIEF SUMMARY OF THE INVENTION

Accordingly, a main objective of the present invention is to provide an interactive test equipment for quality evaluation of an insulative electric resistance value of an electric power cable. The interactive test equipment in accordance with the present invention is used to allow test subjects determining whether a cable is in a good or poor condition through an interactive test method, and then to authenticate and evaluate a judgment ability of the test subjects.

In addition, another main objective of the present invention is to provide an interactive test equipment for quality evaluation of an insulative electric resistance value of an electric power cable. The interactive test equipment in accordance with the present invention is used to ensure that the test subjects can instantly find out in time whether insulation effect of a cable is damaged when they work in a construction site so as to avoid electric shock accident happened on personnel and to further ensure safety of a working environment.

Based on the above, the above mentioned objectives and effects of the present invention are physically fulfilled mainly through the following technical solutions. The interactive test equipment is disposed on a platform, and at least includes a controller, a question type tester and an operator.

The controller is disposed to process data and instructions for the question type tester and the operator. The controller is also disposed to save and load different test question types in the question type tester. Besides, the controller is electrically connected with a power source to supply power to the interactive test equipment.

The question type tester is signally connected with the controller. The question type tester includes at least a test set for quality evaluation. Each of the at least a test set has a circuit diagram area simulating a cable connecting status of a circuit breaker, a transformer and a plurality of power using equipment in a power distribution panel. Besides, at least an electric resistance value measurer is disposed in the circuit diagram area of the each of the at least a test set. Each of the at least an electric resistance value measurer can be used to label a location for measuring electric resistance values. Furthermore, an electric voltage value display and an electric resistance value display are respectively disposed in the each of the at least an electric resistance value measurer.

The operator is signally communicated with the controller. The operator includes at least an answer selecting switch set corresponding to the each of the at least a test set. Each of the at least an answer selecting switch set includes a normal switch and an abnormal switch. Besides, the operator includes an initiating switch acting to load test question types and start tests in the interactive test equipment. In addition, the operator further includes a result judgment set. The result judgment set includes a result switch to initiate the interactive test equipment summarizing test results, a pass light and a fail light.

Accordingly, through physically fulfilling the above technical solutions, the interactive test equipment for quality evaluation of an insulative electric resistance value of an electric power cable in accordance with the present invention is used to allow test subjects determining whether insulation of a cable is in a good or poor condition through an interactive test method, and then to authenticate and evaluate a judgment ability of the test subjects in order for ensuring that the test subjects can instantly find out in time about insulation effect of an electric cable when they work in a construction site so as to further ensure safety of a working environment. As a result, practicality of the interactive test equipment can be effectively enhanced, added values of related products can be increased, and economic benefits of the interactive test equipment can be promoted.

Besides, the above objectives and effects of the present invention are further achieved through the following technical solution.

An indicating light set is respectively disposed beside the each of the at least an answer selecting switch set of the operator. The indicating light set includes a normal light and an abnormal light respectively corresponding to the normal switch and the abnormal switch.

An action light is disposed beside the initiating switch of the operator.

The controller can be signally connected with a voice module in order to output reminding or alerting sounds or voices.

In order to enable the honorable Examiner to further understand constitutions, features and other objectives of the present invention, the following is exemplified to show several preferred embodiments of the present invention, and detailed descriptions thereof are provided hereinafter in cooperation with the drawings. At the same time, those who are familiar with the same technical field can physically practice the present invention accordingly.

DETAILED DESCRIPTION OF THE INVENTION

The present invention is related to an interactive test equipment for quality evaluation of an insulative electric resistance value of an electric power cable. The following illustrations based on specified physical embodiments of the present invention are used to illustrate technical contents of the present invention so that the ordinarily skilled in the art can easily understand advantages and efficacy according to illustrated contents in the specification. Besides, the present invention can also be implemented or applied according to other different physical embodiments. In physical embodiments and components therein in accordance with the present invention illustrated in accompanying drawings, all references regarding designated sizes, front and back, left and right, a top portion and a bottom portion, an upper portion and a lower portion and a horizontal direction and a vertical direction are only used for convenient illustrations, and are not used to limit the present invention or limit components of the present invention in any position or spatial direction. The present invention can be varied according to designs and requirements of physical embodiments of the present invention without departing from the claimed scope of the present invention.

Figure 1:
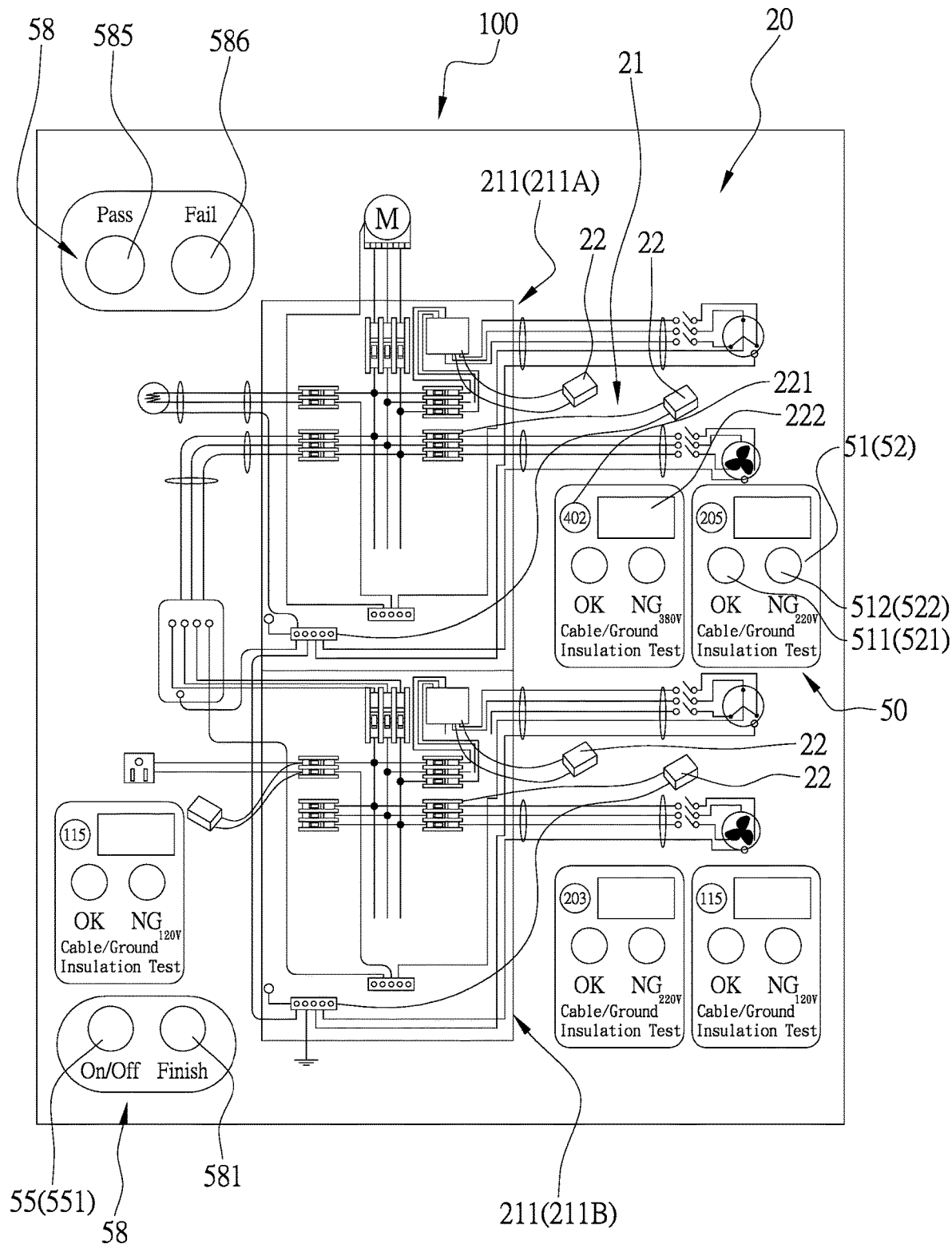
FIG. 1 shows a schematic test panel structural diagram of an interactive test equipment for quality evaluation of an insulative electric resistance value of an electric power cable in accordance with a preferred embodiment of the present invention to illustrate a configuration of the interactive test equipment and an application thereof in tests in a using status of the interactive test equipment.
Figure 2:
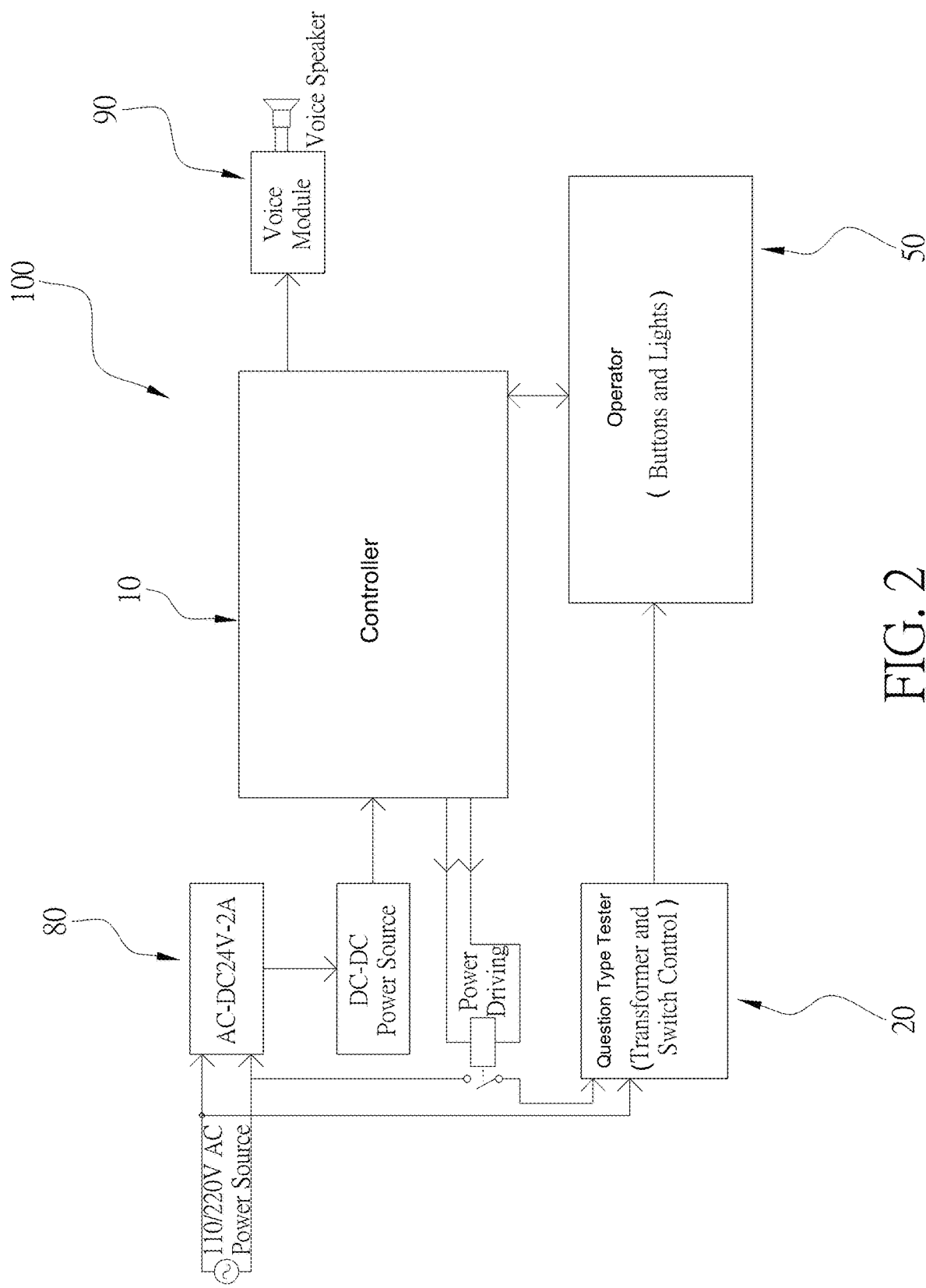
FIG. 2 shows a schematic circuit configuration diagram of the interactive test equipment for quality evaluation of an insulative electric resistance value of an electric power cable in accordance with a preferred embodiment of the present invention.

Referring to FIGS. 1-2, a structure of an interactive test equipment for quality evaluation of an insulative electric resistance value of an electric power cable in accordance with the present invention is provided and shown. The interactive test equipment is disposed on a platform 100 to at least include a controller 10, a question type tester 20 and an operator 50.

The controller 10 is disposed to have data or instructions for processing, loading and outputting the question type tester 20 and the operator 50. The controller 10 is also disposed to save different question types in order to load the different question types in the question type tester 20. Besides, the controller 10 is electrically connected with a power source 80 to supply power to the controller 10, the question type tester 20, the operator 50 of the interactive test equipment. In addition, according to some embodiments in accordance with the present invention, the controller 10 is further signally connected with a voice module 90 in order to output reminding or alerting sounds or voices.

The question type tester 20 is signally connected with the controller 10. The question type tester 20 includes at least a test set 21 for quality evaluation to determine whether a cable is in a good or poor condition. Each of the at least a test set 21 has a circuit diagram area 211 simulating a cable connecting status of a circuit breaker, a transformer and a plurality of power using equipment in a power distribution panel. Besides, at least an electric resistance value measurer 22 is disposed in the each of the at least a test set 21. Each of the at least an electric resistance value measurer 22 can be used to label a location for measuring electric resistance values (for example, between a cable and another cable, or between a cable and ground). Furthermore, an electric voltage value display 221 and an electric resistance value display 222 are respectively disposed in the each of the at least an electric resistance value measurer 22. Test subjects can determine whether insulation of corresponding cables is good or poor based on electric voltage values and electric resistance values respectively displayed by the electric voltage value display 221 and the electric resistance value display 222 of the at least an electric resistance value measurer 22.

In addition, the operator 50 is signally communicated with the controller 10. The operator 50 includes at least an answer selecting switch set 51 corresponding to the each of the at least an electric resistance value measurer 22 of the at least a test set 21. Each of the at least an answer selecting switch set 51 includes a normal switch 511 and an abnormal switch 512. The normal switch 511 and the abnormal switch 512 can be buttons. The each of the at least an answer selecting switch set 51 is used for the test subjects to select answers via the normal switch 511 or the abnormal switch 512 based on electric voltage values and electric resistance values between a cable and another cable or between a cable and ground displayed by the electric voltage value display 221 and the electric resistance value display 222 of the each of the at least an electric resistance value measurer 22. According to some embodiments in accordance with the present invention, an indicating light set 52 is respectively disposed beside the each of the at least an answer selecting switch set 51. The indicating light set 52 includes a normal light 521 and an abnormal light 522 respectively corresponding to the normal switch 511 and the abnormal switch 512 in order to display answers selected by the test subjects for facilitating confirmation from the test subjects and test supervisors. Meanwhile, the operator 50 includes an initiating switch 55 acting to start tests in the interactive test equipment. The initiating switch 55 can be a button. Further according to some embodiments in accordance with the present invention, an action light 551 is respectively disposed beside the initiating switch 55. The action light 551 is used to display the interactive test equipment is electrified to be initiated, and tests taken by the test subjects can be started. In addition, the operator 50 further includes a result judgment set 58. The result judgment set 58 includes a result switch 581 to initiate the interactive test equipment summarizing test results, a pass light 585 and a fail light 586. The result switch 581 can be a button. Furthermore, the initiating switch 55 is used to restart the interactive test equipment, and load new question types in the interactive test equipment.

Accordingly, the interactive test equipment for quality evaluation of an insulative electric resistance value of an electric power cable in accordance with the present invention is constituted to allow test subjects proceeding their cable insulation judgment.

Figure 3:
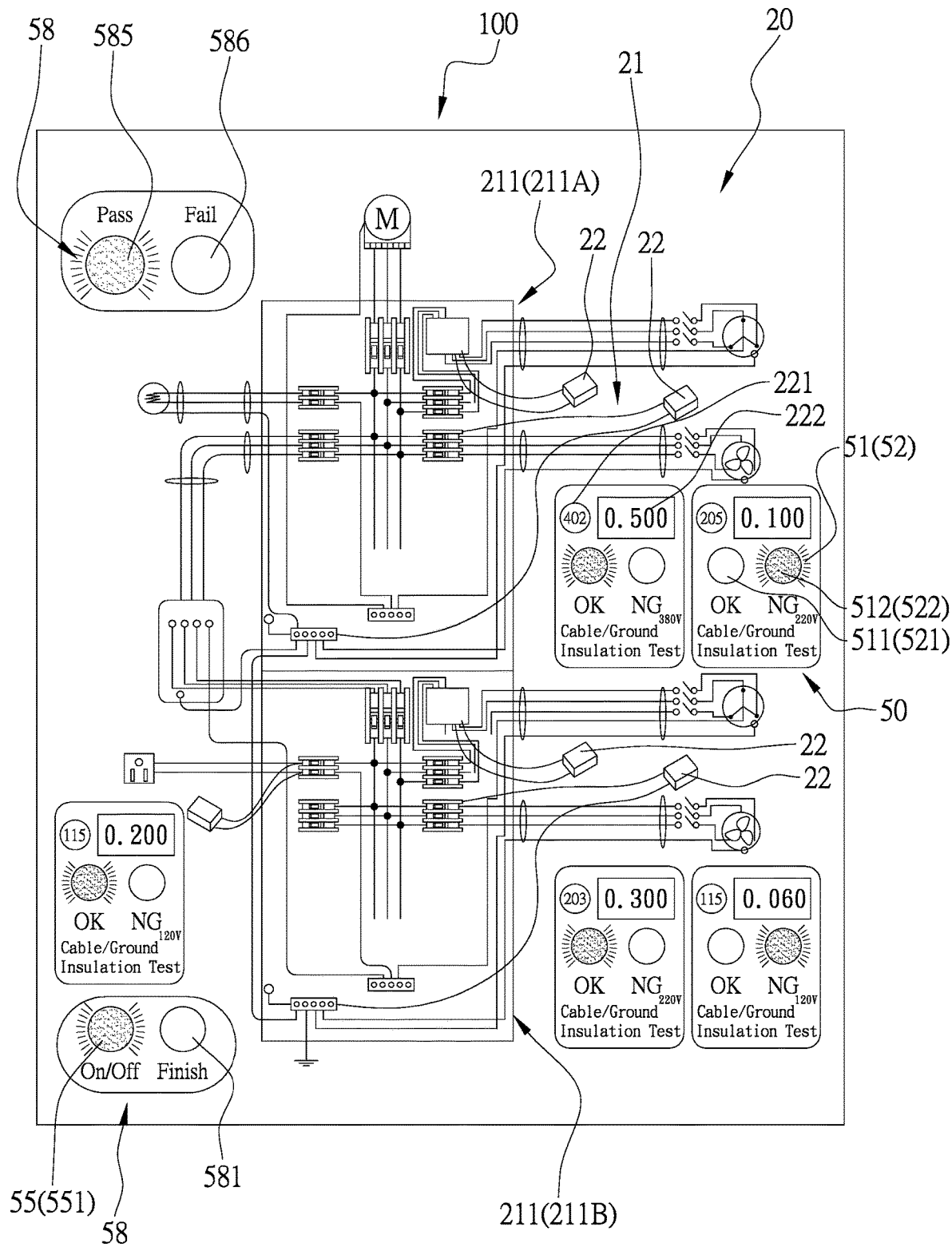
FIG. 3 shows a schematic using status diagram of the interactive test equipment for quality evaluation of an insulative electric resistance value of an electric power cable in accordance with a preferred embodiment of the present invention to illustrate an actual using status during a test.
Figure 4:
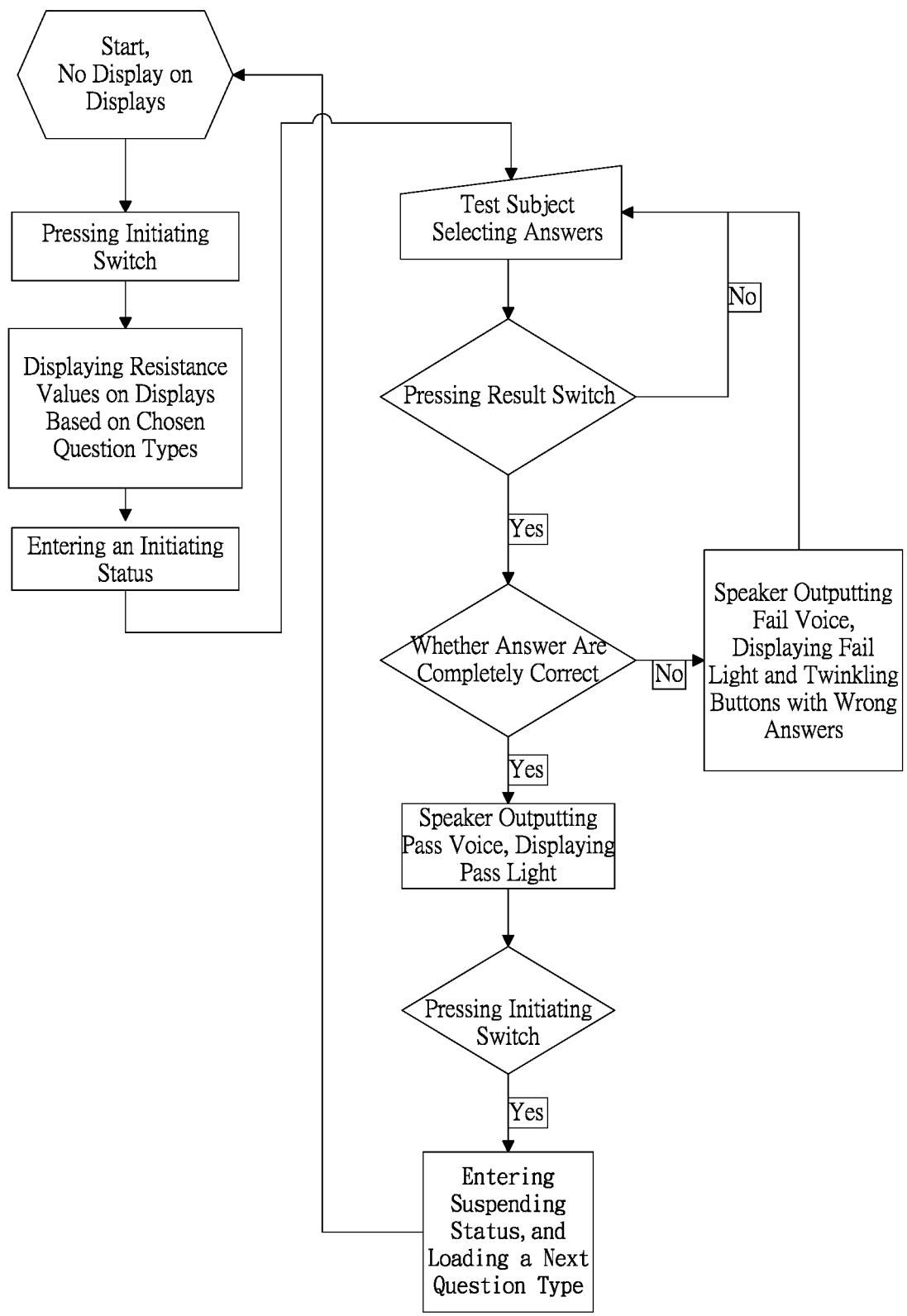
FIG. 4 shows a schematic test flow chart diagram of the interactive test equipment for quality evaluation of an insulative electric resistance value of an electric power cable in accordance with a preferred embodiment of the present invention to illustrate testing steps.

Referring to FIGS. 3-4, actual test steps and processes for the interactive test equipment for quality evaluation of an insulative electric resistance value of an electric power cable in accordance with the present invention are shown. In practice, a test subject presses the initiating switch 55 of the operator 50 to power the interactive test equipment and to prepare the interactive test equipment being ready for the test subject so that the test subject can proceed through the interactive test equipment to determine whether insulation of cables in the at least an electric resistance value measurer 22 of the each of the at least a test set 21 is in a good or poor condition. The controller 10 accordingly displays electric voltage values and electric resistance values of the each of the at least an electric resistance value measurer 22 on a corresponding electric voltage value display 221 and a corresponding electric resistance value display 222 based on a chosen question type.

Subsequently, the test subject proceeds to select answers through the interactive test equipment. The test subject determines whether insulation between a cable and another cable or between a cable and ground of a corresponding one of the at least an electric resistance value measurer 22 is in a good or poor condition based on electric voltage values and electric resistance values respectively displayed by the electric voltage value display 221 and the electric resistance value display 222 of the at least an electric resistance value measurer 22. Meanwhile, the test subject presses a corresponding one of the at least an answer selecting switch set 51 of the operator 50 to the each of the at least an electric resistance value measurer 22 based on the determined answers, i.e., presses a corresponding normal switch 511 or abnormal switch 512 of the corresponding one of the at least an answer selecting switch set 51 based on the determined answers. Afterwards, the result switch 581 of the operator 50 is pressed by the test subject. When the controller 10 determines the at least an answer selecting switch set 51 corresponding to the at least an electric resistance value measurer 22 of the each of the at least a test set 21 selected by the test subject is not completely correct, the voice module 90 outputs a fail voice, and light emitting elements disposed in the normal switch 511 or the abnormal switch 512 of the each of the at least an answer selecting switch set 51 with a wrong answer thereon twinkle. The test subject retakes the test and answers based on the above method and steps.

On the contrary, when the controller 10 determines the at least an answer selecting switch set 51 selected by the test subject for all of the at least an electric resistance value measurer 22 are completely correct, the voice module 90 outputs a pass voice, and the initiating switch 55 can be pressed so that the interactive test equipment enters a suspending status. After the controller 10 loads a new question type for all of the at least an electric resistance value measurer 22 of the each of the at least a test set 21 of the question type tester 20, the test for different test subjects to determine whether an insulative electric resistance value of an electric power cable under testing is in a good or poor condition can be repeatedly proceeded.

Based on the above illustrations, the interactive test equipment for quality evaluation of an insulative electric resistance value of an electric power cable in accordance with the present invention is disposed on a platform 100 thereof to include the controller 10, the question type tester 20 and the operator 50, and the controller 10, the question type tester 20 and the operator 50 are signally connected with one another. The question type tester 20 includes the at least a test set 21, and each of the at least a test set 21 has a design of the at least an electric resistance value measurer 22 having the electric voltage value display 221 and the electric resistance value display 222. Based on the above design, the electric voltage value display 221 and the electric resistance value display 222 of the each of the at least an electric resistance value measurer 22 can display electric voltage values and electric resistance values of a corresponding cable. Test subjects can initiate the interactive test equipment and select answers through the operator 50, and load questions and determine answers through the controller 10. As a result, the interactive test equipment is used to allow test subjects determining whether insulation of a cable is in a good or poor condition through an interactive test method, and then to authenticate and evaluate a judgment ability of the test subjects in order to ensure safety of a working environment.

Accordingly, it can be understood that the present invention is an extremely creative invention. In addition to effectively solving problems faced by the ordinarily skilled in the art, the present invention is also configured to greatly improve efficacy. Besides, no identical or similar product in the same technical field can be found to be invented or in public use, and the present invention has enhanced advantages simultaneously. Therefore, the present invention meets requirements of "novelty" and "non-obviousness" as stipulated for utility patent applications in the patent law, and a patent application for the present invention is filed in accordance with the patent law.

What is claimed is:

1. An interactive test equipment for quality evaluation of an insulative electric resistance value of an electric power cable, wherein the interactive test equipment is disposed on a platform, and at least comprises a controller, a question type tester and an operator;

the controller is disposed to process data and instructions for the question type tester and the operator, the controller is disposed to save and load different test question types in the question type tester, the controller is electrically connected with a power source to supply power to the interactive test equipment;

the question type tester is signally connected with the controller, the question type tester comprises at least a test set for quality evaluation, each of the at least a test set comprises a circuit diagram area simulating a cable connecting status of a circuit breaker, a transformer and a plurality of power using equipment in a power distribution panel, at least an electric resistance value measurer is disposed in the circuit diagram area of the each of the at least a test set, each of the at least an electric resistance value measurer is configured to label a location for measuring electric resistance values, an electric voltage value display and an electric resistance value display are respectively disposed in the each of the at least an electric resistance value measurer;

the operator is signally communicated with the controller, the operator comprises at least an answer selecting switch set corresponding to the each of the at least a test set, each of the at least an answer selecting switch set comprises a normal switch and an abnormal switch, the operator comprises an initiating switch acting to load test question types and start tests in the interactive test equipment, the operator further comprises a result judgment set, the result judgment set comprises a result switch to initiate the interactive test equipment summarizing test results, a pass light and a fail light;

wherein a test subject determines whether insulation of a corresponding cable is in a good or poor condition based on electric voltage values and electric resistance values respectively displayed in the each of the at least an electric resistance value measurer, and the interactive test equipment for quality evaluation of an insulative electric resistance value of an electric power cable is constituted.

2. The interactive test equipment for quality evaluation of an insulative electric resistance value of an electric power cable as claimed in claim 1, wherein an indicating light set is respectively disposed beside the each of the at least an answer selecting switch set of the operator, the indicating light set comprises a normal light and an abnormal light respectively corresponding to the normal switch and the abnormal switch.

3. The interactive test equipment for quality evaluation of an insulative electric resistance value of an electric power cable as claimed in claim 1, wherein an action light is disposed beside the initiating switch of the operator.

4. The interactive test equipment for quality evaluation of an insulative electric resistance value of an electric power cable as claimed in claim 1, wherein the controller is signally connected with a voice module in order to output reminding or alerting sounds or voices.

* * * * *